(12) United States Patent
Summerfelt et al.

(10) Patent No.: US 8,907,446 B2
(45) Date of Patent: Dec. 9, 2014

(54) INTEGRATED CIRCUIT STRUCTURE WITH CAPACITOR AND RESISTOR AND METHOD FOR FORMING

(75) Inventors: Scott R. Summerfelt, Garland, TX (US); Byron L. Williams, Plano, TX (US); Scott K. Montgomery, Rowlett, TX (US); James Klawinsky, Murphy, TX (US); Asad M. Haider, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 249 days.

(21) Appl. No.: 12/783,044

(22) Filed: May 19, 2010

(65) Prior Publication Data

US 2010/0295149 A1    Nov. 25, 2010

Related U.S. Application Data

(60) Provisional application No. 61/179,630, filed on May 19, 2009.

(51) Int. Cl.
| | | |
|---|---|---|
| *H01L 29/00* | (2006.01) | |
| *H01L 49/02* | (2006.01) | |
| *H01L 23/522* | (2006.01) | |
| *H01L 27/01* | (2006.01) | |

(52) U.S. Cl.
CPC ............ *H01L 28/40* (2013.01); *H01L 23/5223* (2013.01); *H01L 23/5228* (2013.01); *H01L 27/016* (2013.01); *H01L 28/24* (2013.01); *H01L 28/60* (2013.01); *H01L 28/20* (2013.01)
USPC ..................... 257/528; 257/296; 257/E23.142

(58) Field of Classification Search
USPC ........................... 257/296, 528, 532, E23.142
See application file for complete search history.

(56) References Cited

U.S. PATENT DOCUMENTS

| | | | | |
|---|---|---|---|---|
| 7,029,925 | B2 * | 4/2006 | Celii et al. ........................ | 438/3 |
| 2004/0042261 | A1 * | 3/2004 | Tuttle ............................. | 365/158 |
| 2006/0060907 | A1 * | 3/2006 | Kim et al. ...................... | 257/303 |
| 2007/0182616 | A1 * | 8/2007 | Quinn et al. ................... | 341/154 |
| 2008/0237866 | A1 * | 10/2008 | Wang ............................. | 257/753 |
| 2009/0127603 | A1 * | 5/2009 | Yamakawa et al. ........... | 257/295 |
| 2009/0140421 | A1 * | 6/2009 | Lin et al. ........................ | 257/737 |
| 2009/0236689 | A1 * | 9/2009 | Daly et al. ..................... | 257/531 |
| 2010/0059853 | A1 * | 3/2010 | Lin et al. ........................ | 257/528 |

* cited by examiner

*Primary Examiner* — Julia Slutsker
(74) *Attorney, Agent, or Firm* — Jacqueline J. Garner; Frederick J. Telecky, Jr.

(57) ABSTRACT

An integrated circuit structure with a metal-to-metal capacitor and a metallic device such as a resistor, effuse, or local interconnect where the bottom plate of the capacitor and the metallic device are formed with the same material layers. A process for forming a metallic device along with a metal-to-metal capacitor with no additional manufacturing steps.

10 Claims, 5 Drawing Sheets

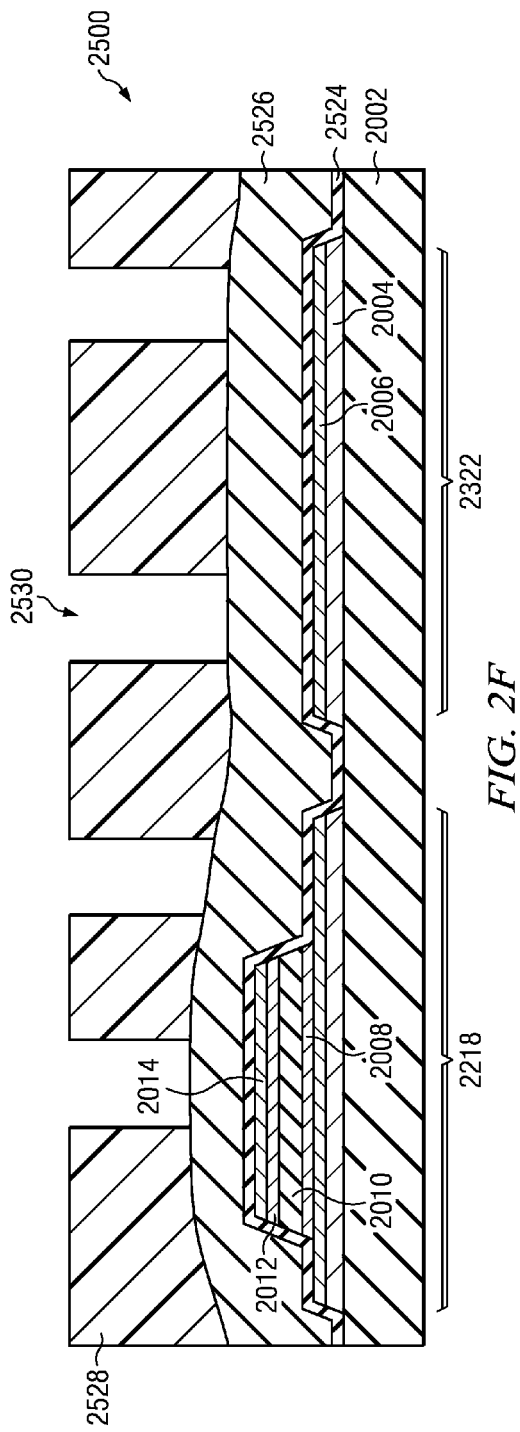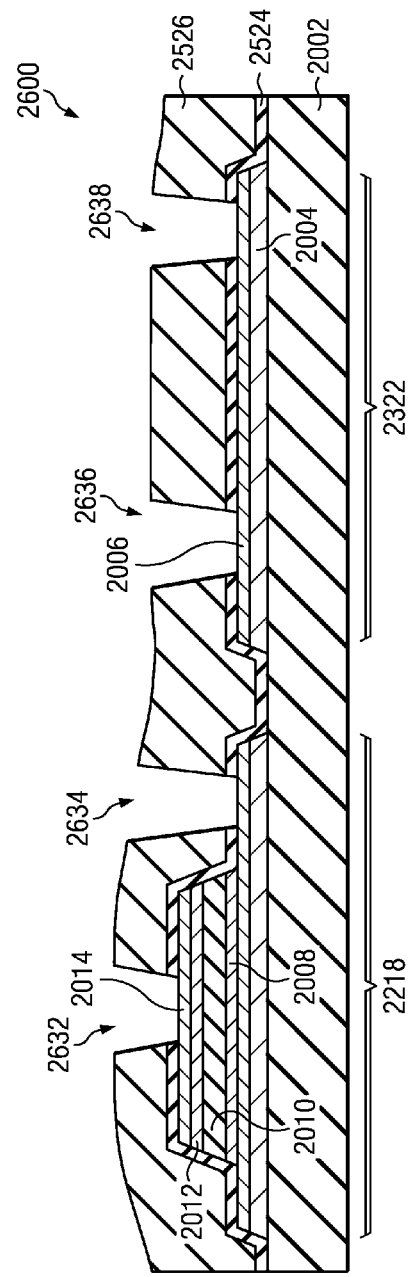

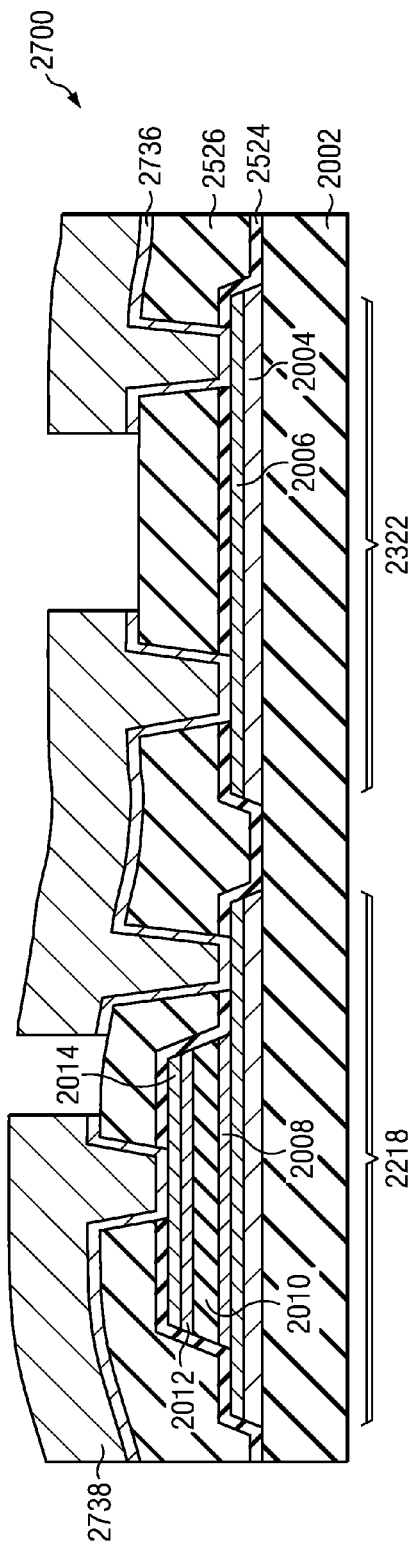
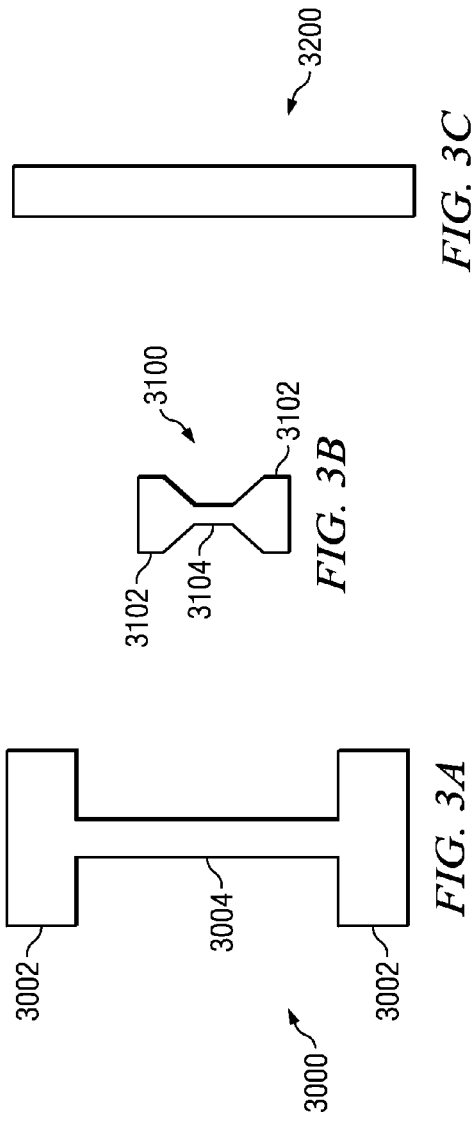

INTEGRATED CIRCUIT STRUCTURE WITH CAPACITOR AND RESISTOR AND METHOD FOR FORMING

FIELD OF THE INVENTION

This invention relates to the field of integrated circuits. More particularly, this invention relates to formation of a resistor.

BACKGROUND OF THE INVENTION

Current integrated circuits are often formed with many complex and costly fabrications steps. Patterning steps are particularly costly. In addition to transistors, metal-to-metal capacitors and metal resistors are common devices in semiconductor integrated circuits. Some metal capacitors such as interdigitated metal finger capacitors may be formed without extra patterning steps, but most metal to metal capacitors such as a lower metal plate to an upper metal plate capacitor requires at least two and often three additional patterning steps.

Metal resistors are typically formed in the integrated circuit using additional steps such as deposition of the metallic resistor material plus resistor patterning and etching steps. A reduction in the number of processing steps, particularly patterning steps, is desired.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit structure with a metal-to-metal capacitor and a metallic device such as a resistor where the bottom plate of the capacitor and the metallic device are formed with the same material layer or layers. A process for forming a metal-to-metal capacitor and another metallic device such as a resistor.

DESCRIPTION OF THE VIEWS OF THE DRAWING

FIG. 2A through FIG. 2H are illustrations of steps in the fabrication of integrated circuits formed according to embodiments.

FIG. 3 is a plan view of a resistor, an electrically programmable fuse, and interconnect formed according to embodiments.

DETAILED DESCRIPTION

Figure 1:
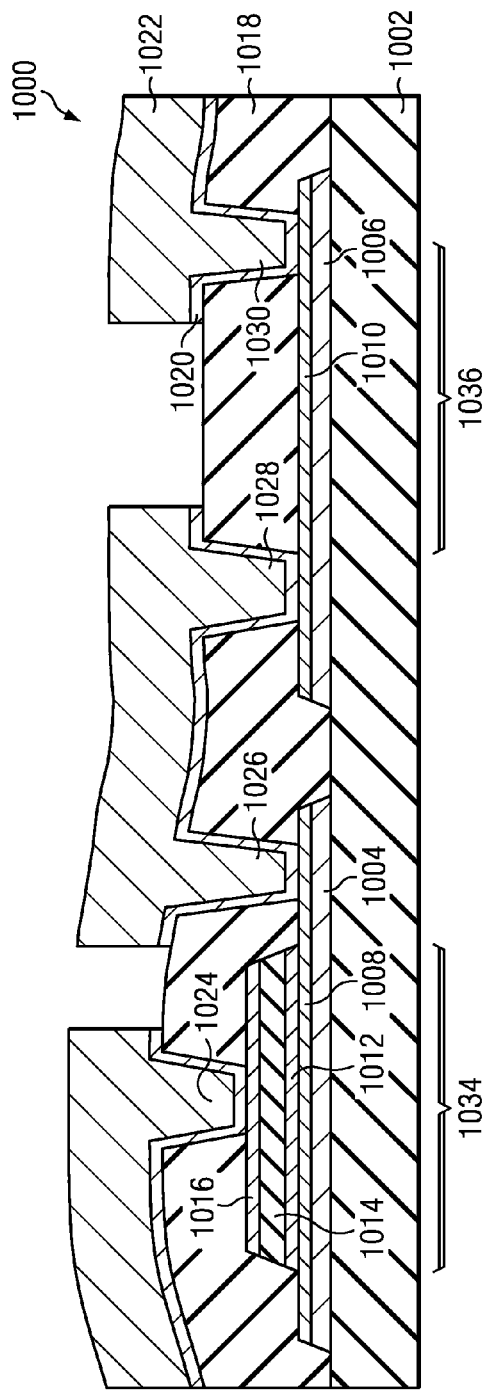
FIG. 1 is a cross-section of an integrated circuit with a capacitor and a resistor formed according to an embodiment.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Resistors and capacitors are components commonly formed within the interconnect layers of integrated circuits. Typically to form a capacitor requires at least two and often three patterning and etching steps. One pattern to define the top plate of the capacitor, a second pattern to etch the dielectric of the capacitor, and a third pattern to define the bottom plate and the contact area for the bottom plate of the capacitor. To form a resistor requires at a minimum deposition of the resistor material plus patterning and etching of the resistor. To construct capacitors and resistors within the interconnect layers of a typical integrated circuit may require three to four patterning steps in addition to the added deposition and etching steps adding significant cost to the integrated circuit manufacturing cost.

FIG. 1 shows a capacitor 1034 and a metallic device 1036 formed according to one embodiment. The metallic device 1036 could be a resistor or local interconnect or an electrically programmable fuse. The embodiment also includes an etch stop layer 1010 which significantly improves the uniformity of the resistor across the wafer. This metallic device 1036 and capacitor 1034 may be built within the interconnect layers (not shown) of an integrated circuit (1000). The metallic device 1036 and capacitor 1034 are built on a dielectric layer 1002. The capacitor 1034 bottom plate is formed with a resistive metallic layer 1004, a conductive etch stop layer 1008, and a lower resistance metallic layer 1012. The metallic device 1036 is formed with a resistive metallic layer 1006 which is the same material as 1004 and a conductive etch stop layer 1010 which is the same material as 1008. The type of metal and the resistance of the metal used in metallic layer 1006 is selected depending upon which type of metallic device 1036 is being fabricated. The capacitor 1034 also includes a capacitor dielectric 1014 and a top electrode 1016. Overlying the capacitor 1034 and metallic device 1036 is dielectric layer 1018. Vias, 1024 and 1026, have been etched to make electrical contact to the capacitor top plate 1016 and the capacitor bottom plate 1026, and vias, 1028 and 1030, have been etched to make electrical contact to the metallic device, 1036. Interconnect composed of a barrier metal 1020 and metal 1022 fills the vias.

A resistor is chosen to illustrate the embodiment which utilizes only two photoresist patterning steps and also eliminates a resistor material deposition step thus significantly reducing manufacturing cost. FIGS. 2A through 2H illustrate the major manufacturing steps for simultaneously forming a ferroelectric capacitor (FeCap), 2218, and a resistor, 2322, according to this embodiment. Although the present illustration describes the simultaneous formation of a ferroelectric capacitor, 2218, which may be a FRAM memory cell in a FRAM memory array, and a resistor, 2322; other types of capacitors may also be formed simultaneously with metallic devices such as a local interconnect, an electrically programmable fuse, or a resistor.

Figure 2A:
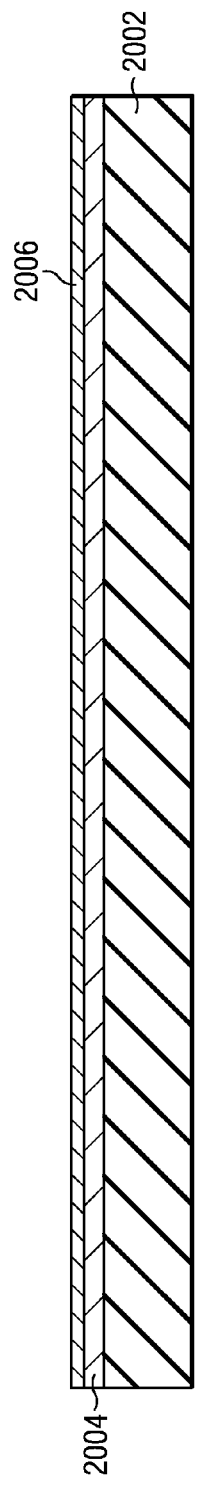

FIG. 2A shows a partially processed integrated circuit 2000 after the layers which will form the bottom plate of the FeCap, 2218, and the resistor, 2322, have been deposited. A resistive material 2004 followed by a high resistance but conductive etch stop layer 2006 is deposited on dielectric layer 2002. The resistive material 2004 may be a metal such as TiAl, Ti, TiN, TiON, TiCON, Ta, TaN, TaON, TaCON, Ir, TiAlN, TiAlON, W, TiW, SiCr, NiCr, and TiWN. The deposited thickness may be in the range of 50 to 500 nm. The high resistance but conductive etch stop layer 2006 may be TiAlN, TiSiN, TaSiN, CrN, or HfN. The deposited thickness may be in the range of 50 to 100 nm. When the metallic device is a resistor, it is preferable that the resistance of the etch stop layer be approximately 10× or more higher than the underlying resistor material to minimize across wafer variability due to differences in thickness of the etch stop layer that may result from across wafer etch rate variation. The resistor, 2322, may be built without the etchstop layer, but without this etchstop layer the variability in the resistance of the resistor may increase significantly across the wafer. One embodiment resistor may be formed by first depositing a 100 nm TiAl film and then depositing an overlying 85 nm TiAlON etch stop film. The TiAl layer may have a Ti to Al atomic ratio between 80:20 and 50:50. The TaAlON etch stop film may have a Ti to Al ratio within 20% of the Ti to Al ratio in the TiAl layer and may have a Ti plus Al atomic concentration approximately equal to the N+O atomic concentration and may have a N to O ratio between approximately 95:5 and 60:40. Both films may be deposited one after the other in the same deposition chamber. A resistor may formed in this manner with a resistance in the range of 6 ohms per square to 500 ohms per square. An integrated circuit (not shown) may be under the dielectric layer 2002 including transistors, contacts, and possibly one or more metal interconnect levels. The capacitor and resistor may be built prior to metal-1 or it may be built above one or more metal interconnect levels.

Figure 2B:
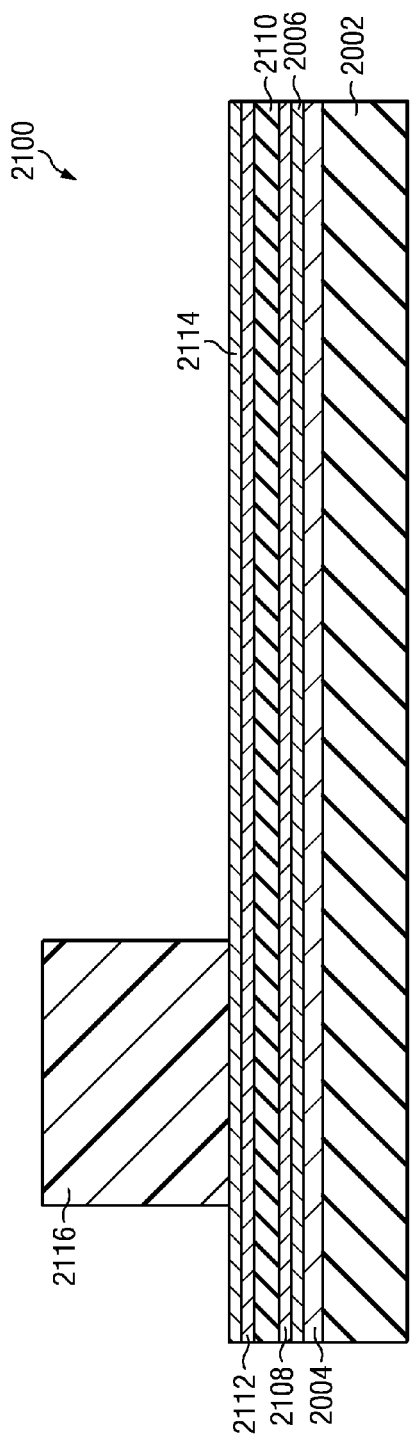

FIG. 2B shows the integrated circuit 2100 after the layers to form the FeCap, 2322, have been deposited. These layers include a metal bottom electrode layer 2108 which may be composed of Ir, Pt, IrOx/Ir, Ru, or SrRuO$_3$/Ru, for example; a capacitor dielectric layer 2110 which may be composed a high K dielectric such as PZT, for example; and a top electrode 2112 which may be composed of Ir, Pt, Irox/Ir, Ru, or SrRuO$_3$/Ru, for example. A conductive etch stop layer 2114 composed of TiAlN, TiSiN, TaSiN, CrN, or HfN, for example, may also be deposited if desired. In an example embodiment the top 2110 and bottom 2108 electrodes are composed of an IrOx/Ir film 50 nm thick and PZT capacitor dielectric film 400 nm thick. A top plate photoresist pattern 2116 is formed to define the capacitor. An embodiment where a metal-to-metal capacitor (non FeCap) is being built, may be formed with top and bottom capacitor plates such as TiN or TaN and with a capacitor dielectric of silicon nitride or silicon oxide, for example.

Figure 2C:
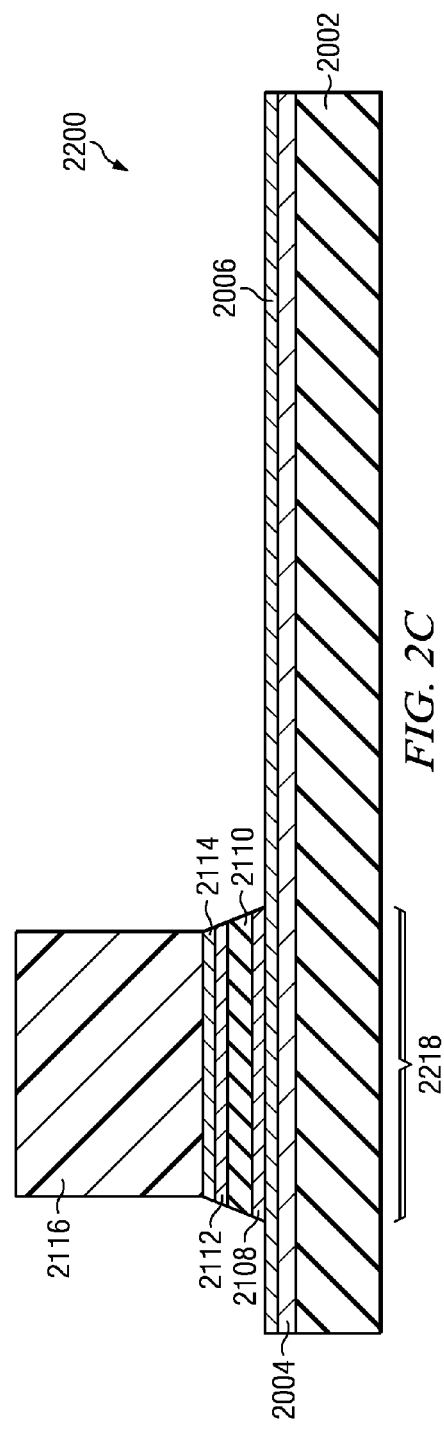

Shown in FIG. 2C, is the capacitor structure 2218 following the capacitor etch which removes the exposed areas of conductive etchstop layer 2114, capacitor top electrode 2112, capacitor dielectric 2110, and capacitor bottom electrode 2108 is shown in FIG. 2C. The etch stops on conductive etch stop layer 2006.

Figure 2D:
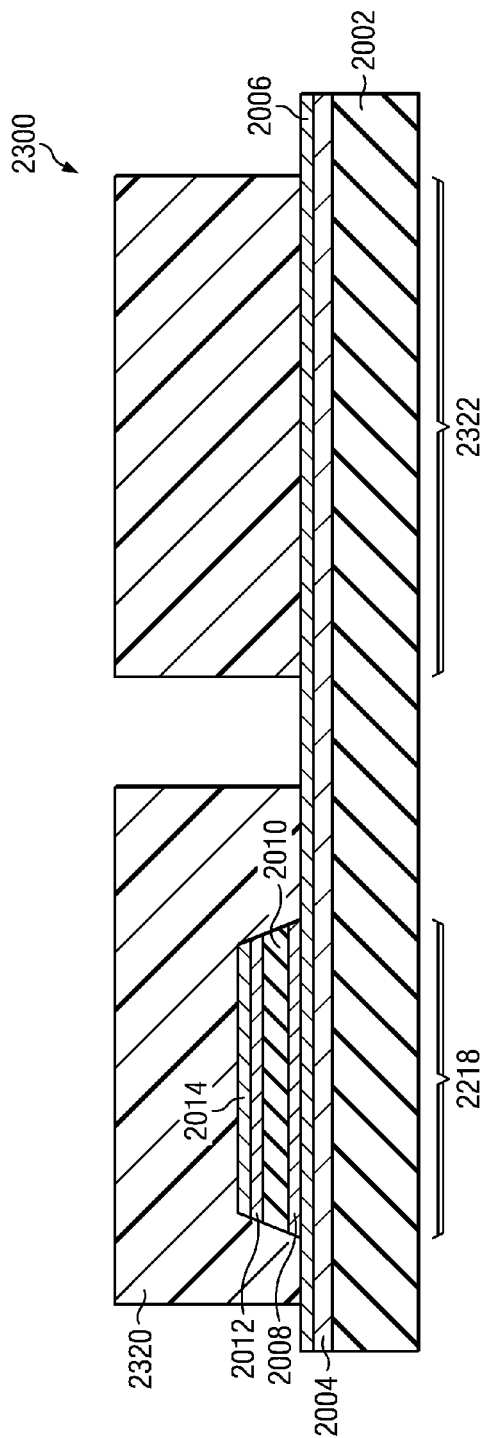
Figure 2E:
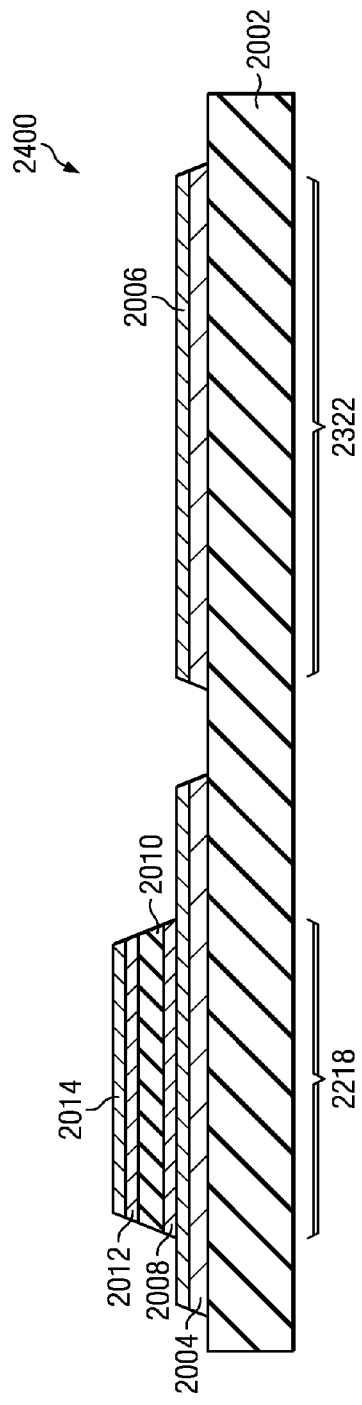

In FIG. 2D, a second photoresist 2320 patterning step which defines the capacitor 2218 bottom plate and also the resistor 2322 is shown in FIG. 2D before etch and in FIG. 2E after etch and after the photoresist pattern 2320 has been removed. The ferroelectric capacitor bottom plate consists of capacitor bottom electrode layer 2108, conductive etch stop layer 2006 and resistive material 2004. Because layers 2004 and 2006 are used to form both the resistor and capacitor, the capacitor can be formed using two patterning steps and the resistor can be added with no additional deposition, patterning, or etching steps. In addition, the high resistivity etch stop layer enables the thickness of the resistor material 2004 to be constant across the wafer even if the capacitor etch is nonuniform.

FIG. 2F shows the partially processed resistor and capacitor 2500 after deposition of a diffusion barrier layer 2524 such as SiN or AlOx for example, and a second dielectric film 2526. In the example embodiment the diffusion barrier is a 100 to 200 nm thick SiN film used to prevent oxygen and hydrogen from diffusing into and causing degradation of the PZT dielectric film. The dielectric film 2526 may be a low K dielectric, PETEOS, or some other dielectric film commonly used to isolate metal 1 from the gate or to isolate one metal layer from another metal layer. Following deposition of the dielectric film, the film may be planarized using CMP, spin on glass, or deposition/etch/deposition for example, although this is not shown in the present example. Photoresist pattern 2528 has been formed on the dielectric 2526 with openings 2530 to form electrical contacts to the capacitor 2218 and resistor 2322.

FIG. 2G shows the partially processed integrated circuit 2600 after vias, 2632 and 2634, have been etched to the capacitor top plate, 2014, and the capacitor bottom plate 2006, and vias, 2636 and 2638, have been etched to both ends of the resistor, 2322. Photoresist pattern 2528 is also removed.

In FIG. 2H metal interconnect has been formed on partially integrated circuit 2700. The barrier layer 2736 may be Ti/TiN and the metal layer 2738 may be AlSi, or the barrier layer 2736 may be TaN and the metal layer 2738 may be copper.

Although simultaneous formation of a capacitor and a resistor has been used to illustrate the invention, it is understood that devices other than a resistor such as an electrically programmable fuse or a local interconnect could also have been used to illustrate the present invention. A top down view of an example resistor 3000, and example electrically programmable fuse 3100 and an example local interconnect 3102 are shown in FIGS. 3A, 3B, and 3B respectively.

The example resistor in FIG. 3A consists of landing pads 3002 for electrically contacting the resistor with vias, and the resistor body 3004. The resistor body 3004 may be a straight resistor as shown in FIG. 3A or may have a number of turns between the pads to form a longer length resistor. Landing pads 3002 and resistor body 3004 are both comprised of the same material layers used in a capacitor bottom electrode plate such as layers 2004 and 2006 described above.

The example electrically programmable fuse in FIG. 3B consists of landing pads 3012 for electrically contacting the fuse with vias to provide current for blowing the fuselink 3104. Landing pads, 3012, and fuselink, 3104, are both comprised of the same material layers used in a capacitor bottom electrode plate such as layers, 2004 and 2006. The shape is for illustration purposes only, other fuse shapes may be used. The fuse link 3104 may be formed of a highly resistive metallic material such as TiN, TiON, TiCON, TaN, TaON, TaCON, TiW, TiAlN, TiAlO, and TiAlON.

The example local interconnect 3200 shown in FIG. 3C may take on any shape needed to form the required electrical connections in the integrated circuit. Local interconnect 3200 is comprised of the same material layers used in a capacitor bottom electrode plate such as layers, 2004 and 2006. The local interconnect 3200 may be formed of a metallic material such as TiAl, W, TiW, Ti, TiN, TiCON, TiON, Ta, TaN, TaON, and TaCON.

While various embodiments of the present invention have been described above, it should be understood that they have been presented by way of example only and not limitation.

Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a dielectric layer;
   a resistive metallic layer over and in direct contact with the dielectric layer;
   a conductive etch stop layer over and in direct contact with the resistive metallic layer
   a metal-to-metal capacitor with a bottom plate consisting essentially of an electrode material, a first portion of the conductive etch stop layer, and a first portion of the resistive metallic layer, wherein the electrode material is over and in direct contact with the first portion of the conductive etch stop layer which is over and in direct contact with the first portion of the resistive metallic layer and
   a metallic device consisting essentially of a second portion of said conductive etch stop layer over and in direct contact with a second portion of said resistive metallic layer.

2. The integrated circuit of claim 1 wherein said metallic device is a resistor and said resistive metallic layer is selected from the group consisting of TiAl, Ti, TiN, Ta, TaN, Ir/TiAlN, Ir, TiAlN, SiCr, NiCr, and TiWN.

3. The integrated circuit of claim 1 wherein said conductive etch stop layer is selected from the group consisting of TiAlON, TiAlN, and TiAlO.

4. The integrated circuit of claim 1 wherein said resistive metallic layer is TiAl with a thickness of 50 to 500 nm and wherein said conductive etch stop layer is TiAlON with a thickness of 50 nm to 100 nm.

5. The integrated circuit of claim 1 wherein said metallic device is a local interconnect and said first metallic material is selected from the group consisting of TiAl, W, TiW, Ti, Ta, and TaN.

6. The integrated circuit of claim 1 wherein said metallic device is an electrically programmable fuse and said first metallic material is selected from the group consisting of TiN, TaN, TiW, TiAlN, and TiAlO.

7. An integrated circuit, comprising:
   a dielectric layer;
   a resistive metallic layer over and in direct contact with the dielectric layer;
   a conductive etch stop layer over and in direct contact with the resistive metallic layer
   a metal-to-metal capacitor having a bottom plate, capacitor dielectric, and a top plate, wherein the bottom plate consists essentially of an electrode material, a first portion of the conductive etch stop layer, and a first portion of the resistive metallic layer, wherein the electrode material is over and in direct contact with the first portion of the conductive etch stop layer which is over and in direct contact with the first portion of the resistive metallic layer, and wherein the capacitor dielectric is over and in direct contact with the electrode material; and
   a metallic device consisting essentially of a second portion of said conductive etch stop layer over and in direct contact with a second portion of said resistive metallic layer.

8. The integrated circuit of claim 7 wherein said metallic device is a resistor and said resistive metallic layer is selected from the group consisting of TiAl, Ti, TiN, Ta, TaN, Ir/TiAlN, Ir, TiAlN, SiCr, NiCr, and TiWN.

9. The integrated circuit of claim 7 wherein said conductive etch stop layer is selected from the group consisting of TiAlON, TiAlN, and TiAlO.

10. The integrated circuit of claim 7 wherein said resistive metallic layer is TiAl with a thickness of 50 to 500 nm and wherein said conductive etch stop layer is TiAlON with a thickness of 50 nm to 100 nm.

* * * * *